United States Patent
Metaferia et al.

(10) Patent No.: US 12,540,417 B2
(45) Date of Patent: Feb. 3, 2026

(54) GROWTH OF SEMICONDUCTOR MATERIALS BY HYDRIDE VAPOR PHASE EPITAXY USING AN EXTERNAL ALUMINUM CHLORIDE GENERATOR

(71) Applicant: Alliance for Energy Innovation, LLC, Golden, CO (US)

(72) Inventors: Wondwosen Tilahun Metaferia, Rio Rancho, NM (US); Kevin Louis Schulte, Denver, CO (US); Aaron Joseph Ptak, Littleton, CO (US); John David Simon, Austin, TX (US)

(73) Assignee: Alliance for Energy Innovation, LLC, Golden, CO (US)

( * ) Notice: Subject to any disclaimer, the term of this patent is extended or adjusted under 35 U.S.C. 154(b) by 543 days.

(21) Appl. No.: 17/754,503

(22) PCT Filed: Oct. 1, 2020

(86) PCT No.: PCT/US2020/053812
§ 371 (c)(1),
(2) Date: Apr. 4, 2022

(87) PCT Pub. No.: WO2021/067603
PCT Pub. Date: Apr. 8, 2021

(65) Prior Publication Data
US 2023/0062711 A1     Mar. 2, 2023

Related U.S. Application Data

(60) Provisional application No. 62/910,923, filed on Oct. 4, 2019.

(51) Int. Cl.
*C30B 25/14*     (2006.01)
*C30B 29/40*     (2006.01)
*H01L 21/02*     (2006.01)

(52) U.S. Cl.
CPC .............. *C30B 25/14* (2013.01); *C30B 29/40* (2013.01); *H01L 21/02543* (2013.01);
(Continued)

(58) Field of Classification Search
CPC ....... C30B 25/14; C30B 29/40; C30B 25/165; C30B 29/16; H01L 21/02543;
(Continued)

(56) References Cited

U.S. PATENT DOCUMENTS 7,645,340 B2    1/2010    Koukitu et al.
8,465,587 B2    6/2013    Solomon et al.
(Continued)

FOREIGN PATENT DOCUMENTS

JP     2006-073578 A     3/2006
JP     2007-042854 A     8/2011
(Continued)

OTHER PUBLICATIONS

Chen, C.H. et al., "OMVPE Growth of AlGaInP for High-Efficiency Visible Light-Emitting Diodes," Semiconductors and Semimetals, vol. 48, Chapter 4, 52 pages.
(Continued)

*Primary Examiner* — Mohammad A Rahman
(74) *Attorney, Agent, or Firm* — Neal S. Vickery; Sam J. Barkley

(57) ABSTRACT

Disclosed herein is the controlled epitaxy of $Al_xGa_{1-x}As$, $Al_xIn_{1-x}P$, and $Al_xGa_yIn_{1-x-y}P$ by hydride vapor phase epitaxy (HVPE) through use of an external $AlCl_3$ generator.

11 Claims, 12 Drawing Sheets

(52) U.S. Cl.
CPC .... *H01L 21/02546* (2013.01); *H01L 21/0262* (2013.01); *H01L 21/02395* (2013.01); *H01L 21/02433* (2013.01)

(58) Field of Classification Search
CPC .......... H01L 21/02546; H01L 21/0262; H01L 21/02395; H01L 21/02433
See application file for complete search history.

(56) References Cited

U.S. PATENT DOCUMENTS

| | | | |
|---|---|---|---|
| 8,778,783 | B2 | 7/2014 | Melnik et al. |
| 9,520,697 | B2 | 12/2016 | Steigerwald et al. |
| 2006/0011135 | A1 | 1/2006 | Dmitriev et al. |
| 2012/0295418 | A1* | 11/2012 | Melnik ............. H01L 21/02304 257/E21.108 |
| 2013/0337636 | A1* | 12/2013 | Kuech ............... H01L 21/02546 257/E21.09 |
| 2014/0349427 | A1 | 11/2014 | El-Ghoroury et al. |
| 2015/0229108 | A1* | 8/2015 | Steigerwald .............. H01S 5/22 372/45.01 |

FOREIGN PATENT DOCUMENTS

| | | |
|---|---|---|
| JP | 2011-244009 A | 12/2011 |
| JP | 2015221740 | 12/2015 |
| JP | 2019-506742 A | 3/2019 |
| JP | 2018-093113 A | 1/2022 |
| WO | 2012162196 A2 | 11/2012 |

OTHER PUBLICATIONS

Hasegawa, F. et al., "Vapor Phase Epitaxial Growth of AlAs by Chloride Transport Method," Journal of Electrochemical Society, Solid-State Science and Technology, Jun. 1987, 7 pages.

Hasegawa, F. et al., "Chloride VPE of AlxGa1-xAs by the Hydrogen Reduction Method Using a Metal Al Source," Japanese Journal of Applied Physics, vol. 27, No. 2, Feb. 1988, 5 pages.

Kobayashi, R. et al., "Low temperature growth of GaAs and AlAs by direct reaction between GaCl3, AlCl3 and AsH3," Journal of Crystal Growth, vol. 113, 1991, 8 pages.

Liquid Phase Epitaxy of Electronic, Optical and Optoelectronic Materials, Edited by P. Capper and M. Mauk, Wiley, 2007, 450 pages.

Yamaguchi, H. et al., "Vapor Phase Epitaxy of AlGaAs by Direct Reaction between AlCl3, GaCl3 and AsH3/H2," Japanese Journal of Applied Physics, vol. 28, No. 1, Jan. 1989, 3 pages.

PCT Search Report and Written Opinion from the corresponding PCT patent application, dated Jan. 8, 2021, 8 pages total.

English translation of JP 2015-221740 A, Tokuyama Corp., published Dec. 10, 2015, prepared by Thomson, 30 pages.

Corresponding European Search Report dated Aug. 21, 2023, 8 pages.

First Office Action for co-pending Japanese Patent Application No. 2022-520432, dated Jun. 4, 2024, pp. 1-17 (English Machine Translation Provided).

* cited by examiner

Figure 11 (a) left and (b) right

GROWTH OF SEMICONDUCTOR MATERIALS BY HYDRIDE VAPOR PHASE EPITAXY USING AN EXTERNAL ALUMINUM CHLORIDE GENERATOR

CROSS-REFERENCE TO RELATED APPLICATIONS

This application claims priority under 35 U.S.C. § 119 to U.S. provisional patent application No. 62/910,923 filed on 4 Oct. 2019, the contents of which are hereby incorporated in their entirety.

CONTRACTUAL ORIGIN

The United States Government has rights in this invention under Contract No. DE-AC36-08GO28308 between the United States Department of Energy and Alliance for Sustainable Energy, LLC, the Manager and Operator of the National Renewable Energy Laboratory.

BACKGROUND

Al-containing arsenide and phosphide materials are integral to the performance of numerous III-V optoelectronic devices. Substitution of Al for Ga in GaAs and GaInP leads to large increases in band gap but minimal change in lattice constant, providing a nearly independent knob with which to tune band gap. This property enables the formation of abrupt, high quality heterobarriers vital to the performance of optoelectronic devices such as transistors, light emitting diodes, and photovoltaics. Al-containing compounds can also serve as wide band gap active regions in optoelectronic devices, with the Al solid fraction providing direct control over the device band gap.

Hydride vapor phase epitaxy (HVPE) is an epitaxial growth method with the potential to reduce epitaxial growth costs for III-V optoelectronics. HVPE predates the development of metalorganic vapor phase epitaxy (MOVPE), the dominant III-V growth technique used in production today. From the 1970s to the 1980s, commercial production of light emitting diodes and photodetectors and emitters for the telecommunications industry was achieved using HVPE. HVPE was regarded as the best choice for creating materials with exceptional purity and electronic quality but began to fall out of favor relative to MOVPE in the 1980s for two main reasons. First, MOVPE enabled the formation of extremely abrupt heterointerfaces with ease, whereas HVPE historically struggled with heterointerfaces due to high growth rates and process inertia related to in situ generation of the group III precursors. Second was HVPE's well-known difficulties with deposition of Al-containing materials, another growth aspect for which MOVPE was well-suited.

Aluminum monochloride (AlCl), analogous to commonly utilized HVPE precursors GaCl and InCl, is highly unstable, and will etch quartz, requiring alumina or graphite components. Further complicating matters, attempts to grow Al-containing compounds from AlCl required growth temperatures of up to 1000° C. to suppress pre-deposition. Large differences in the thermodynamics of growth of GaAs and AlAs precluded the formation of $Al_xGa_{1-x}As$ alloys from GaCl and AlCl; rather, only binary phases could be formed. The large $K_{eq}$ for growth of AlAs from AlCl implies a large driving force for deposition of this material, which was difficult to control at more traditional growth temperatures. Eventually, researchers did demonstrate $Al_xGa_{1-x}As$ grown by HVPE, but only by using a mixed Ga/Al source, which is not conducive to commercial production due to differences in Al and Ga depletion rates in the melt that lead to drifting solid composition. In large part due to these difficulties, MOVPE became the dominant technique for III-V optoelectronic device production.

Aluminum monochloride is not the only possible Al-containing HVPE precursor, however. Aluminum trichloride, $AlCl_3$, is significantly more stable than AlCl, and does not react readily to form AlAs, as demonstrated by the miniscule equilibrium constant for deposition of AlAs from $AlCl_3$. Despite the low driving force for solid deposition directly from $AlCl_3$, various reports throughout the late 1980s and early 1990s demonstrated that growth of AlAs and $Al_xGa_{1-x}As$ by HVPE was possible at temperatures as low as 500° C. using $AlCl_3$. Likely, those results were achieved through a kinetically-controlled growth pathway.

$AlCl_3$ is a solid below about 195° C. and has a low vapor pressure at room temperature. Thus, a heated source and process lines are required to transport this precursor using an inert carrier, though some groups have used this embodiment. This method is limited in the molar flow rate that it can deliver at standard line temperatures and bubbler flows, however. An alternative method is to generate $AlCl_3$ from solid Al and HCl. Thermodynamic calculations indicate that formation of $AlCl_3$ is favored over AlCl at temperatures below about 700° C., with $AlCl_3$ selectivity increasing as the Al source temperature is reduced. These same predictions suggest that $AlCl_3$ could decompose to AlCl+HCl when it reaches hotter parts of the reactor downstream, which could create problems related to the reactive monochloride. However, there is evidence from high-temperature (<1000° C.) Al-nitride growth that the $AlCl_3$ molecule resists decomposition after it has been generated. $AlCl_3$ generation can be accomplished in situ or externally, which can provide increased flexibility in the design of the quartz reaction vessel.

A longstanding problem in LPE is related to growth of Al-containing III-V alloys that are of interest to optoelectronics and especially visible LEDs. With the notable exception of AlGaAs, many Al-containing III-V alloys, such as AlInP and AlGaInP, are notoriously difficult to grow by LPE. This is perhaps ironic since, historically, one of the original and most compelling motivations to develop LPE was related to its ability to grow AlGaAs structures; AlGaAs was less susceptible to oxidation effects in LPE than CVD. Previously, there has been a near impossibility of growing the AlGaInP alloys either by LPE or chloride VPE. More generally, prior to the development of MOCVD and the use of organometallic precursors for Al, the high affinity of Al compounds for oxygen made vapor phase growth of Al-containing III-V materials impractical. For LPE of AlGaInP, the difficulty was related to controlled incorporation of Al into the solidifying III-V epilayer. Specifically, phase equilibria calculations indicate that the growth of AlGaInP from Al—In—Ga—P melts (or the growth of AlInP from Al—In—P melts) requires a melt composition that is dilute in aluminum ($X_{Al}\approx10-4$) and rich in indium. However, the high segregation coefficient of Al in indium melts ($k_{Al}\approx104-105$) means that the melt is rapidly depleted of aluminum, and the Al fraction in the epilayer changes drastically.

Inadequate control of segregation to achieve target composition profiles of ternary and quaternary layers is a severe drawback of LPE. Since to a first order, the composition of the LPE layer is determined by phase equilibria considerations, this problem would appear to be a fundamental limitation of LPE.

Prior efforts have achieved LPE-grown AlInGaP with high Al content using short growth times from a one equilibrium solution with a high aluminum fraction, and by growing the AlGaInP on an $Al_{0.9}Ga_{0.1}As$ buffer layer. AlGaInP electroluminesce emission wavelengths of 645 nm were measured. Although this is outside the 590-630 nm range of commercial ultrabright AlGaInP LEDs, it suggests that improvements in the aluminum segregation phenomena for Al-/In-containing III-V alloys are possible.

In general, the compositional grading observed in LPE is due to two effects: depletion of components from the melt as discussed above, and variation in the temperature-dependent segregation as the melt is cooled. A large segregation coefficient (e.g. k>10) exacerbates melt depletion effects. More complex melt compositions that include 'neutral' components such as bismuth, tin, lead, and other components that are not incorporated to a significant degree into the epitaxial layer, but which may modify the segregation coefficients of epilayer components, can be considered.

Thus, it is conceivable that melt compositions and additions to the melt can be tailored to increase/decrease the liquid phase activity coefficients for particular components, and thereby increase/decrease their segregation coefficients. In particular, 'neutral solvents' such as Pb and Bi in III-V LPE can be explored for effects on segregation. A supersaturation dependence of segregation coefficients in solution growth may also be operative in LPE. The temperature effects on segregation can be ameliorated by using a steady-state method of growth with a solid source and driven by an imposed temperature difference or by electric current induced electromigration or Peltier effects. Whether in general the segregation coefficient of a species can be modified by as much as a factor of 10 or 100 by optimizing melt composition is not certain.

The segregation of components may be modified by application of electric currents across the growth interface such as derived expressions for the variation of (dopant) segregation in LPEE terms of LPEE growth parameters. Presumably, the segregation of alloy components (e.g. Al) in addition to dopants, could be similarly altered by application of an electric current. Further, the use of an AlGaAs (or AlGaP) solid source in contact with the melt during growth, rather than using a GaAs (or GaP) source, or relying on an As-saturated, Al-containing melt, might be used to replenish the melt with Al, and thus reduce compositionally grading due to depletion of Al from the melt Similar approaches have been used with solution growth of bulk GaInSb crystals where a polycrystalline GaInSb is used for continuous solute feeding of the growth solution. For the case of Al segregation in Al-containing III-V alloys, estimates of the degree to which the segregation can be altered by electroeptiaxy effects or tailoring melt composition indicate modest utility of these approaches, although melt compositions that might dramatically impact aluminum segregation have not been fully explored. It has been demonstrated that the aluminum segregation in AlGaAs LPE could be substantially modified by using ultrafast cooling rates ($102\text{-}10^3°$ $Cs^{-1}$), and that aluminum composition gradients in the epilayer could be reversed from what is observed in LPE with slow cooling.

Another option is to grow thin layers of the alloy semiconductor in successive LPE steps. In the case of aluminum III-V alloys, a stack of thin layer of high-Al content alloy could be grown from separate melts, followed by post-growth annealing to level the composition profile. Finally, certain growth techniques to control segregation developed for bulk crystal growth of ternary alloys may be adaptable to LPE. For example, double crucible, floating crucible or solute feeding methods where controlled solute delivery to the growth interface by diffusion through one or more capillaries connecting two melts of distinct compositions, could be implemented for LPE.

In general, the application of LPE for the growth of heterostructures with relatively large lattice mismatch has proved difficult. Typically, LPE has been limited to growth of epitaxial layers with less than 1% relative lattice mismatch between the epitaxial layer and substrate, but as discussed below, there are many exceptions. It is often difficult or problematic to induce a thermodynamic driving force for growth from the liquid phase that is sufficient to overcome the energetic barrier associated with nucleating a lattice-mismatched epilayer on a substrate. The required high supersaturations may lead to homogeneous nucleation in the bulk of the melt. Even if homogeneous nucleation can be avoided, high supersaturations promote three-dimensional discrete nucleation, and the coalescence of discrete nuclei to form a continuous layer results in defects. Also, for many heterostructure pairs there is a significant disequilibrium between the melt and the exposed solid phase (i.e. the substrate or epilayer grown in a previous step), such that appreciable dissolution of the underlying substrate or epilayer occurs upon contact with the melt. As a specific example, to grow InGaP on GaAs, a GaAs substrate is brought in contact with a melt containing In, Ga and P. This melt can never be in equilibrium with a GaAs substrate, and there will be a tendency to meltback the substrate in order to saturate the melt with arsenic, and the regrowth will be InGaAsP. Limitations with regard to the growth of heterostructures constitute one of the major disadvantages of the LPE technique relative to MBE and MOCVD.

Thus, LPE of heterostructures raises a host of issues, many related to phenomena that curtail the applicability of LPE for producing a number of heterostructure types, or else limit the abruptness of the interfaces. Almost inevitable, the interface between the melt and substrate (or previously grown layer) exhibits thermodynamic instability, and this results in potential dissolution (etch-back) of the substrate, which in turn alters the melt composition in the vicinity of the substrate. Fortunately, there are many systems where dissolution can be avoided or minimized including AlGaAs on GaAs, GaAs on InGaP and InGaAs on InP. Often, increasing the supersaturation can sup-press substrate meltback. Meltback has been reduced in GaInAsP/InP LPE heteroepitaxy using a grating surface, a tin-based melt, and low growth temperature. It has been demonstrated that the addition of Se to the melt could prevent substrate melt-back in GaAs on InP LPE. The complex phenomena that occur during LPE heteroepitaxy, such as dissolution of the substrate, solid-phase diffusion of substrate components and liquid-phase diffusion of melt components, formation of transition layers, achievement of local equilibrium and lattice mismatch effects, have been demonstrated.

SUMMARY

In an aspect, disclosed herein is a method for the deposition of Al-containing III-V materials by hydride vapor phase epitaxy (HVPE) through use of an external $AlCl_3$ generator. In an embodiment, the source temperature of the external $AlCl_3$ generator is about 400 degrees Celsius. In an embodiment, the $AlCl_3$ molecules do not decompose during the deposition process. In an embodiment, a deposition temperature ranges from 620 to 700 degrees Celsius. In an embodiment, the Al-containing III-V materials comprise $Al_xGa_{1-x}As$ where x is from 0 to 1. In an embodiment, the V/III ratio of Al-containing III-V materials is from 10 to 300. In an embodiment, the group V species is selected from the group consisting of nitrogen, phosphorus, arsenic, and antimony. In an embodiment, the method further comprises the use of $AsH_3$.

In an aspect, disclosed herein is a method for the HVPE deposition of lattice-matched $Al_xIn_{1-x}P$ and $Al_xGa_yIn_{1-x-y}P$ wherein x varies from 0 to 1 comprising the use of an external $AlCl_3$ generator. In an embodiment, the source temperature of the external $AlCl_3$ generator is about 400 degrees Celsius. In an embodiment, the $AlCl_3$ molecules do not decompose during the deposition process. In an embodiment, a deposition temperature ranges from 620 to 700 degrees Celsius. In an embodiment, the V/III ratio of Al-containing III-V materials is from 10 to 300. In an embodiment, the group V species is selected from the group consisting of nitrogen, phosphorus, arsenic, and antimony. In an embodiment, the method further comprises the use of $AsH_3$.

In an aspect, disclosed herein is an optoelectronic device made by using a method for the deposition of Al-containing III-V materials by HVPE through use of an external $AlCl_3$ generator. In an embodiment, the optoelectronic device is made by a method wherein the source temperature of the external $AlCl_3$ generator is about 400 degrees Celsius. In an embodiment, the optoelectronic device is made by a method wherein the $AlCl_3$ molecules do not decompose during the deposition process. In an embodiment, the optoelectronic device is made by a method wherein a deposition temperature ranges from 620 to 700 degrees Celsius. In an embodiment, the optoelectronic device is made by a method wherein the Al-containing III-V materials comprise lattice-matched $Al_xIn_{1-x}P$ and $Al_xGa_yIn_{1-x-y}P$.

Exemplary embodiments of the invention disclosed herein demonstrate a method for the controlled deposition of Al-containing III-V materials by HVPE through use of an external $AlCl_3$ generator. The generation of $AlCl_3$ vs. AlCl was selected for through use of a 400° C. source temperature, enabling reliable control of the solid Al-composition. The $AlCl_3$ molecule was insensitive to decomposition at typical source and deposition temperatures in the reactor. The effects of growth conditions such as deposition temperature, V/III ratio, and group V species on $Al_xGa_{1-x}As$ solid composition and $Al_xGa_{1-x}As$ growth rate were elucidated. It was discovered that conditions selecting for $AsH_3$ over $As_2/As_4$ strongly promoted incorporation of Al in the film. Control over $Al_xGa_{1-x}As$ composition in the entire range from $x_{Al}=0-1$ as well as the growth of near-lattice-matched $Al_xIn_{1-x}P$ and $Al_xGayIn_{1-x-y}P$ was achieved for the first time by HVPE. These results have implications for the growth of new high-performance optoelectronic devices by HVPE.

Other objects, advantages, and novel features of the present invention will become apparent from the following detailed description of the invention when considered in conjunction with the accompanying drawings.

BRIEF DESCRIPTION OF THE DRAWINGS

FIG. 11a depicts a (004) omega-2theta XRD scan of $Al_{0.53}In_{0.47}P$ epilayer. FIG. 11b depicts a Nomarski microscope image of $Al_{0.53}In_{0.47}P$ with different Al content (20×).

FIG. 12 depicts two upright GaAs devices passivated with $Ga_{0.5}In_{0.5}P$ and $Al_{0.4}Ga_{0.6}As$ that achieved similar quantum efficiency indicating the AlGaAs grown at low temperature, 650° C., (growth temperature also conducive to the growth of GaInP) provides effective passivation.

DETAILED DESCRIPTION

Figure 1:
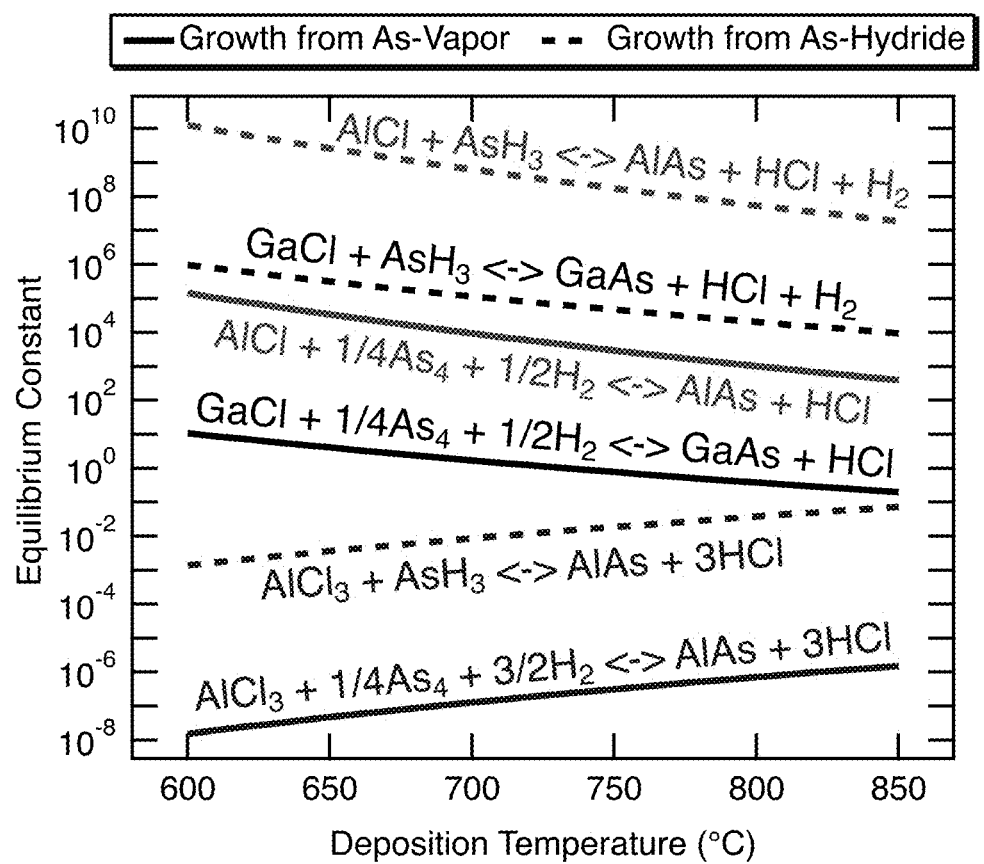
FIG. 1 depicts a plot of the equilibrium constant for deposition of solid AlAs and GaAs using various group III precursors and As-vapor ($As_4$) or As-hydride ($AsH_3$).

Prior to using the methods and devices disclosed herein, it was thought that the quaternary alloy AlGaInP material cannot be grown by conventional high-volume growth processes such as liquid-phase epitaxy (LPE) and hydride vapor-phase epitaxy (VPE). The difference in thermodynamic stability of aluminum phosphide (AlP) and indium phosphide (InP) makes compositional control extremely difficult by LPE. Additionally, the problem of forming a stable aluminum chloride (AlCl) compound during hydride or chloride vapor-phase epitaxy has prevented the successful growth of Al-containing phosphides by VPE.

Disclosed herein are methods and devices for the controlled epitaxy of $Al_xGa_{1-x}As$, $Al_xIn_{1-x}P$, and $Al_xGa_yIn_{1-x-y}P$ by HVPE through use of an external $AlCl_3$ generator. By limiting the Al-source temperature to 400° C. the formation of $AlCl_3$ was promoted instead of AlCl, a precursor that otherwise prevents controlled deposition of multinary Al-containing compounds and is reactive with quartz reactors. It was shown that conversion of HCl to $AlCl_3$ in the source zone reaches a maximum at this temperature. The effects of deposition temperature, V/III ratio, and group V precursor species on the $Al_xGa_{1-x}As$ solid composition and growth rate were determined. It was discovered that the presence of $AsH_3$ at the growth front was effective at kinetically promoting the incorporation of Al into the growing film. The controlled deposition of $Al_xGa_{1-x}As$ was demonstrated, and for the first time, it was demonstrated that $Al_xIn_{1-x}P$, and $Al_xGa_yIn_{1-x-y}P$ growth is possible by HVPE. Using methods and devices disclosed herein, the deposition of new heterobarrier optoelectronic devices with Al-containing layers by HVPE has been demonstrated, results that were previously unattainable.

Disclosed herein are methods and devices for the deposition of Al-containing III-V compounds by HVPE using an external $AlCl_x$ generator. $AlCl_3$ generation was selected for through use of a 400° C. source temperature, enabling controlled deposition of the entire compositional range of $Al_xGa_{1-x}As$ from $x_{Al}$=0-1. It was verified that the $AlCl_3$ molecule is insensitive to decomposition at a typical range of temperatures employed in our reactor. The effect of growth conditions such as growth temperature, V/III ratio, and group V species on $x_{Al}$ and $Al_xGa_{1-x}As$ growth rate were evaluated. Conditions that select for $AsH_3$ over $As_2/As_4$ strongly promote Al-incorporation. The growth of lattice-matched $Al_xIn_{1-x}P$ and $Al_xGa_yIn_{1-x-y}P$ was demonstrated for the first time by HVPE, overcoming previous difficulties with the AlCl precursor that prevented their growth. These results demonstrate that the controlled deposition of Al-containing arsenides and phosphides is possible for HVPE, contrary to what was previously taught in the art.

First, a series of $Al_xGa_{1-x}As$ samples was grown at $T_D$=650° C. to test the HCl->$AlCl_x$ conversion efficiency in the Al-boat at 400° C. by varying the $H_2$ carrier flow rate, $H_2(Al)$, to the Al boat with a constant HCl(Al) flow rate and all other growth conditions constant. This experiment tests the conversion efficiency by varying the residence time of the HCl in the boat. At 400° C., thermodynamic calculations indicate that nearly 100% of the input HCl should be converted to $AlCl_x$ if the system is permitted to reach equilibrium. However, kinetic limitations prevent the system from reaching equilibrium if the residence time of the HCl over the Al in the boat is not sufficiently large, as commonly observed in the Ga source. By increasing the $H_2$ carrier flow rate with a constant HCl flow rate, the residence time of the boat is decreased and one can observe whether Al incorporation in the solid is affected.

Figure 3:
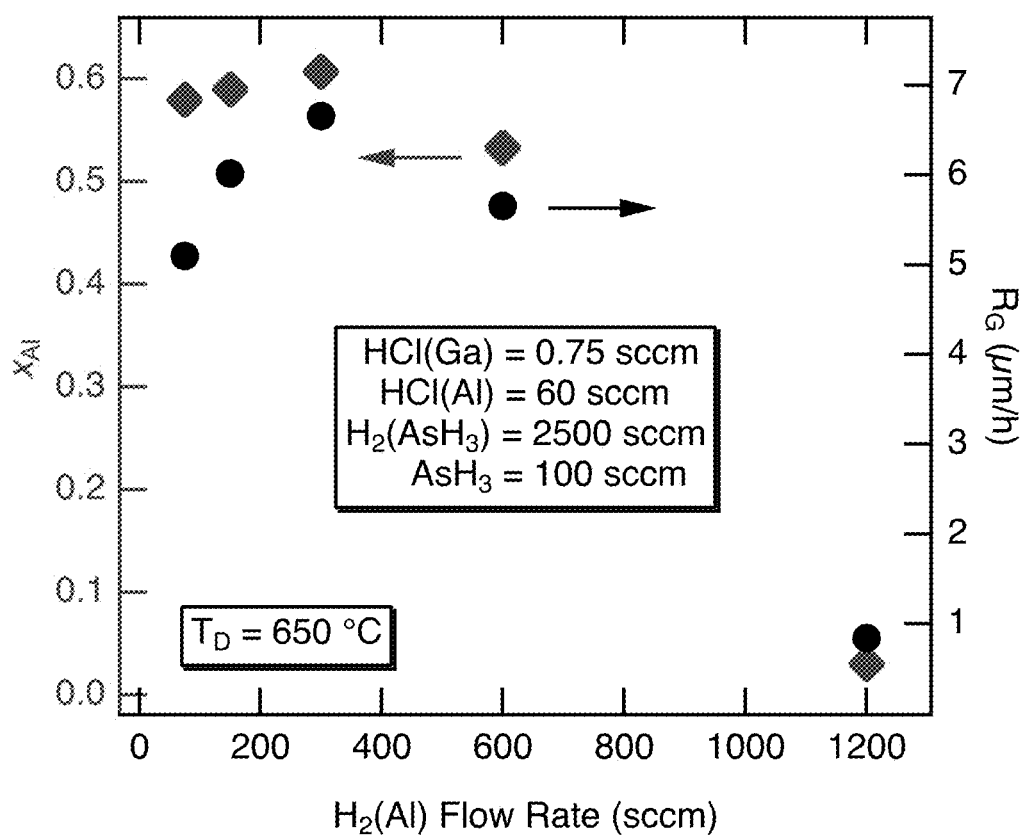
FIG. 3 depicts $x_{Al}$ (left) and growth rate (right) of $Al_xGa_{1-x}As$ epilayers as a function of $H_2$ carrier flow rate to the external Al boat. The HCl flow rate to the boat, as well as all other growth conditions, was held constant.

FIG. 3 shows the Al solid content (left) and growth rate (right) of this series of samples. Initially, as the $H_2(Al)$ flow rate increases from 75 to 300 sccm, $x_{Al}$ increases slightly from 0.58 to 0.61, while the growth rate increases from 5 to 7 μm/h. While the specific cause of these trends is unclear, these results are opposite of what one would expect if the HCl conversion was incomplete, implying that this parameter is not limiting the growth. Above 300 sccm of $H_2(Al)$, the growth rate and $x_{Al}$ decrease drastically, implying that the residence time of HCl in the boat is too short, and the source conversion reaction is no longer reaching completion. The reduced generation of $AlCl_3$ leads to decreased $x_{Al}$ in the solid, and combined with the increased concentration of unreacted HCl in the reactor, suppresses the growth rate. It was noted that the large HCl(Al)/HCl(Ga) ratio of 27 (assuming complete conversion of all HCl to $AlCl_3$ and GaCl) needed to achieve $x_{Al}$=0.5-0.6 suggests that the species reaching the substrate surface is $AlCl_3$, as opposed to the much more reactive AlCl as indicated by FIG. 1. FIG. 1 plots the equilibrium constant, $K_{eq}$, for the growth of GaAs and AlAs from different group III precursors and a) $As_4$ or b) $AsH_3$, calculated from thermochemical data. These calculations neglect to include equilibrium between other gas phase precursors.

Figure 4:
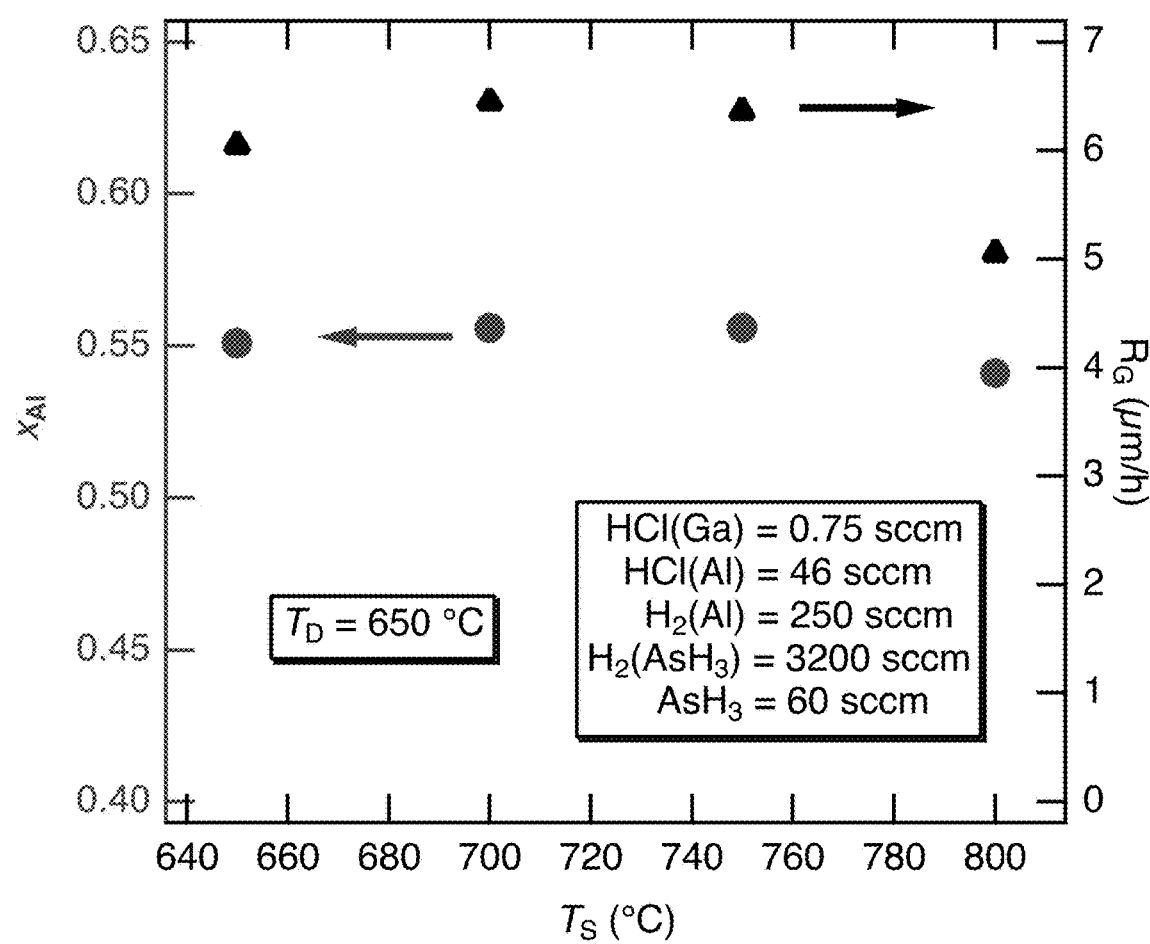
FIG. 4 depicts $x_{Al}$ (left) and growth rate (right) of $Al_xGa_{1-x}As$ epilayers grown with varying ($T_S$) at constant source temperature ($T_D$). All other growth parameters were held constant.

Next, it was investigated whether the $AlCl_3$ generated in the Al source was decomposing into AlCl and HCl before reaching the substrate. Changing the source temperature, $T_S$, is a useful method to alter the chemistry within the reactor without changing $T_D$ or reactant flows. Previously, $T_S$ was varied to affect decomposition of $AsH_3$ in the reactor independently of other growth parameters. FIG. 4 displays the results of a similar experiment, in which $T_S$ varied under constant reactant flows with constant $T_D$ to determine whether this would alter the distribution of $AlCl_x$ species in the reactor. $x_{Al}$ is relatively constant as $T_S$ varies between 650 and 800° C. Growth rate is also relatively constant until showing a decrease at TS=800° C. It is possible that $AsH_3$ decomposition increased at this temperature and led to decreased growth rate. The insensitivity of Al solid content and growth rate to $T_S$, combined with the large HCl(Al)/HCl(Ga) required to obtain compositions above $x_{Al}$>0.50, strongly suggest that the Al growth species in the reactor is $AlCl_3$, and that it is not substantially decomposing to AlCl.

Figure 5:
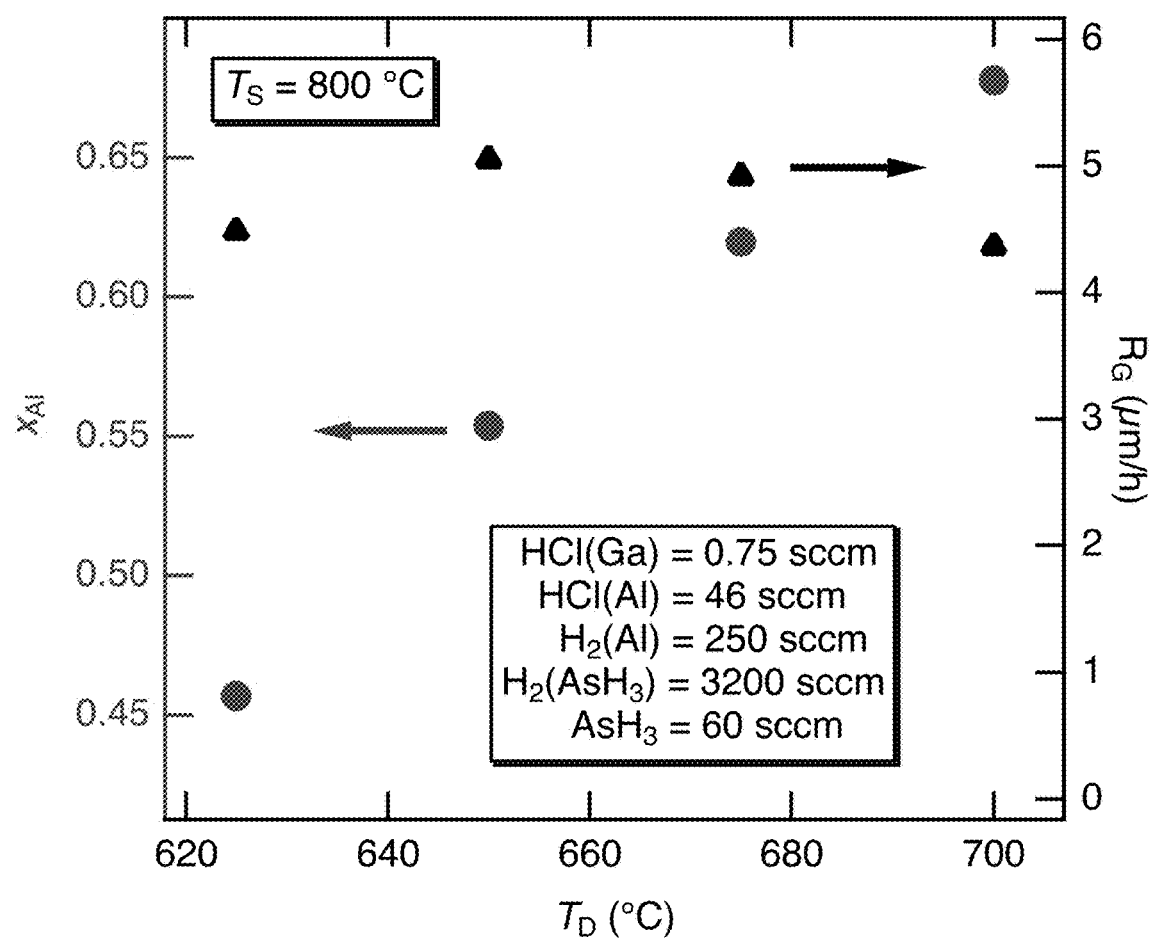
FIG. 5 depicts $x_{Al}$ (left) and growth rate (right) of $Al_xGa_{1-x}As$ epilayers grown with varying deposition temperature ($T_D$) at constant source temperature ($T_S$).

Experiments were performed to understand the growth parameter space for growth of $Al_xGa_{1-x}As$ from $AlCl_3$ by HYPE. FIG. 5 shows the effect of deposition temperature with constant HCl(Al) flow. $x_{Al}$ increases strongly with $T_D$ and the growth varies weakly, passing through a maximum at 650° C. The trend of increasing $x_{Al}$ with $T_D$ agrees with the equilibrium curves in FIG. 1, which predict that the driving force for AlAs growth from $AlCl_3$ increases with $T_D$ while the driving force for GaAs growth from GaCl simultaneously decreases. The growth rate is relatively insensitive in this temperature range because of these opposite trends in $K_{eq}$ for each binary. This result further suggests that $AlCl_3$ is the dominant Al-precursor in the reactor, because growth from AlCl and GaCl is expected to exhibit a monotonic growth rate decrease based on FIG. 1.

Figure 6:
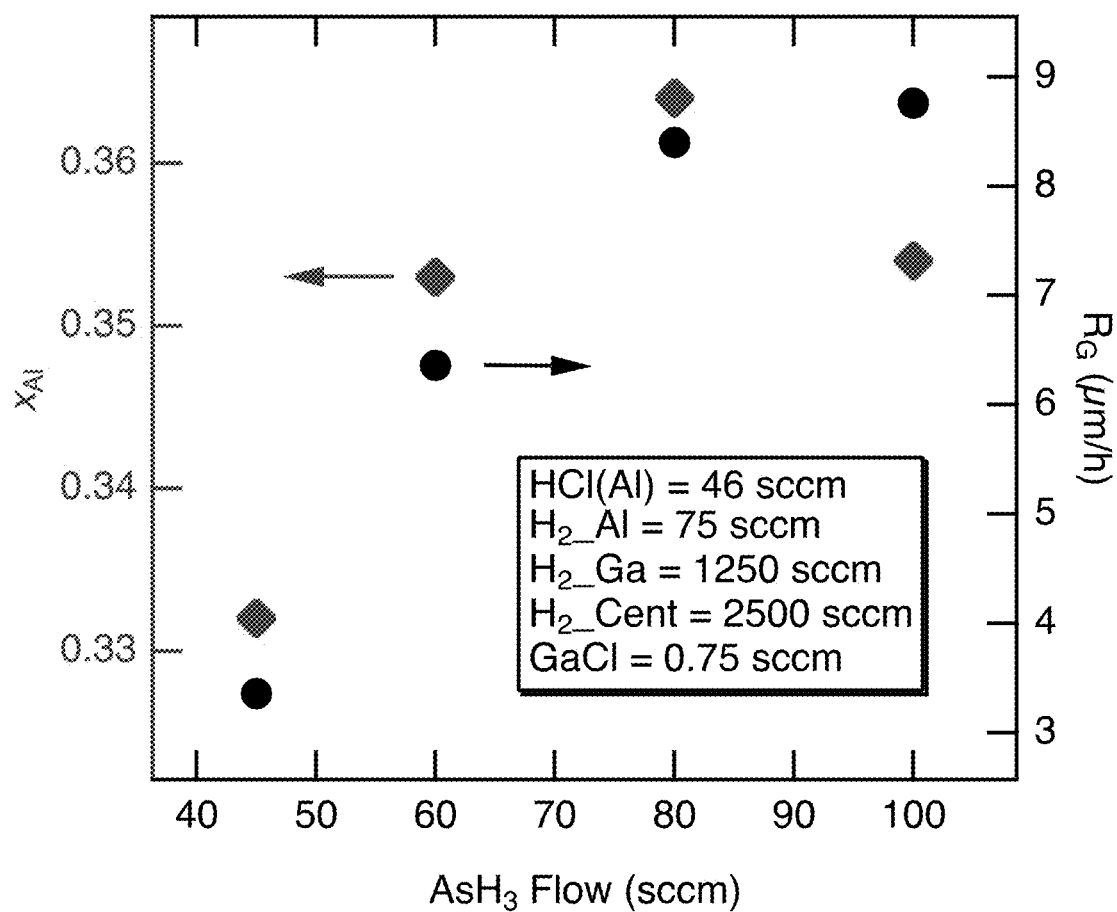
FIG. 6 depicts $x_{Al}$ (left) and $Al_xGa_{1-x}As$ growth rate (right) as a function of $AsH_3$ flow rate in epilayers grown with $T_D=650°$ C. and all other parameters constant.

The effects of the both the flow rate and the nature of the group V precursor on $Al_xGa_{1-x}As$ growth were investigated. FIG. 6 shows the effect of $AsH_3$ flow rate on $x_{Al}$ and growth rate. Without being limited by theory, $x_{Al}$ increases weakly as the $AsH_3$ flow rate is increased from 45 to 100 sccm. The growth rate doubles within this range, implying that increased $AsH_3$ flow rate is increasing both Ga and Al incorporation in the solid because of the relative insensitivity of $x_{Al}$ to this parameter. The nature of the group V species has a much stronger effect on $Al_xGa_{1-x}As$ growth. It has been shown that GaAs growth rate could be enhanced by limiting decomposition of the $AsH_3$ precursor into $As_2/As_4$. In that case $AsH_3$ decomposition is limited by increasing the flow rate of $H_2$ carrier input with the $AsH_3$, which increases the velocity of the $AsH_3$ through the reactor and decreases the amount of time it spends in the 800° C. source zone.

Figure 7:
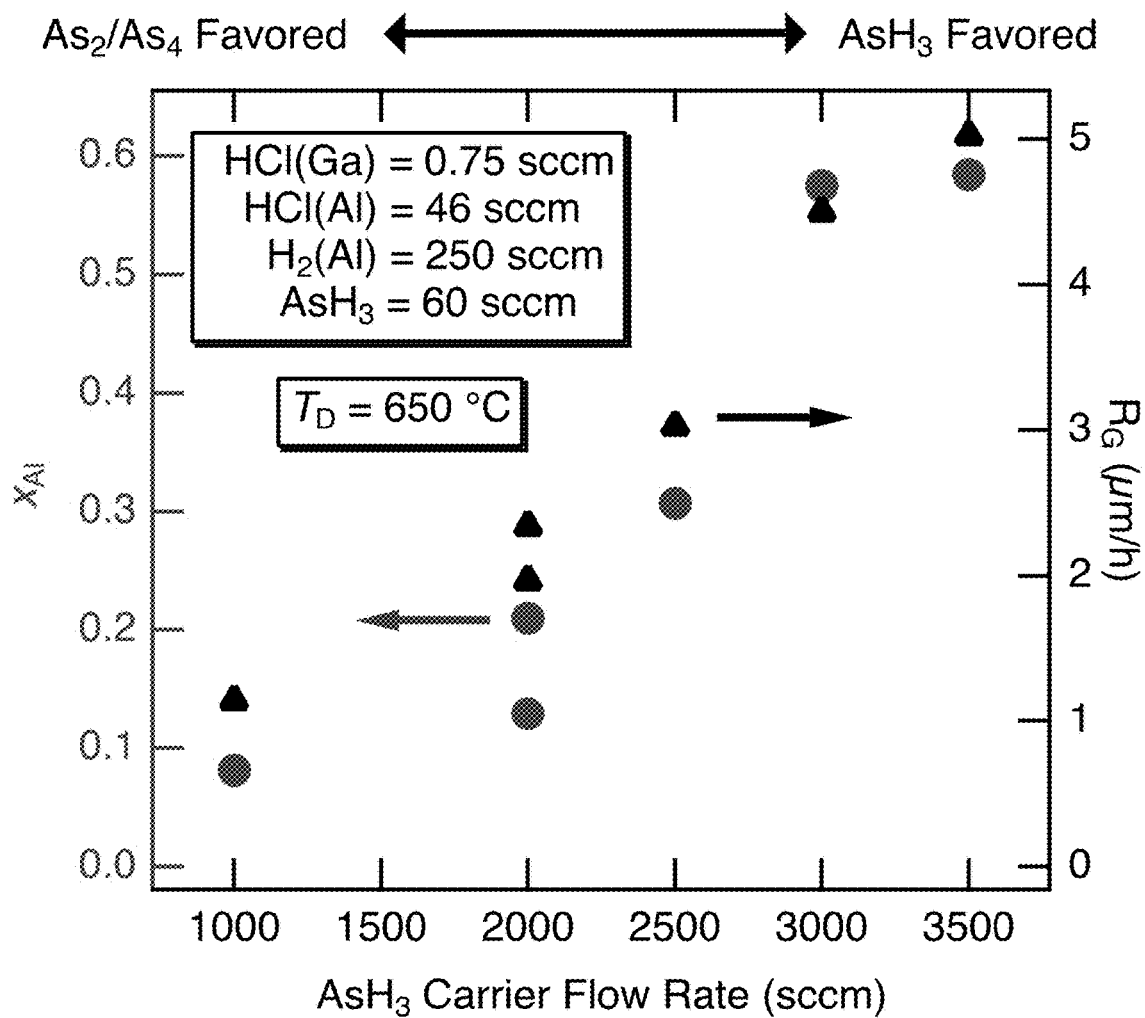
FIG. 7 depicts $x_{Al}$ (left) and $Al_xGa_{1-x}As$ growth rate (right) as a function of $AsH_3$ carrier flow rate in epilayers grown with $T_D=650°$ C. and all other parameters constant.

FIG. 7 shows $x_{Al}$ and growth rate for a series of $Al_xGa_{1-x}As$ samples grown with varying $AsH_3$ carrier flow rate. Note that $H_2$ flow rate was compensated in another reactor port so that the total $H_2$ flow rate and reactant dilution level in the reactor were constant. $x_{Al}$ increases strongly with $AsH_3$ carrier flow rate, and growth rate increases as well. These results imply that the presence of uncracked $AsH_3$ is key to the incorporation of Al. This can be understood by considering that $K_{eq}$ for growth of AlAs from $AlCl_3$ and $As_4$ is extremely low, as seen in FIG. 1, while $K_{eq}$ for AlAs growth from $AlCl_3$ and $AsH_3$ is nearly five orders of magnitude larger. We further note that $K_{eq}$ for AlAs growth from $AlCl_3$ and $AsH_3$ is still below unity at 650° C., however, indicating that the equilibrium calculations do not tell the entire story. It is likely that the presence of unreacted $AsH_3$ modifies the kinetics at the substrate surface. The $AsH_3$ can provide reactive H-radicals that help drive the kinetic reduction of the otherwise highly stable $AlCl_3$ molecule, helping to consume surface $AlCl_3$, explaining the trends observed in FIG. 7.

Figure 8:
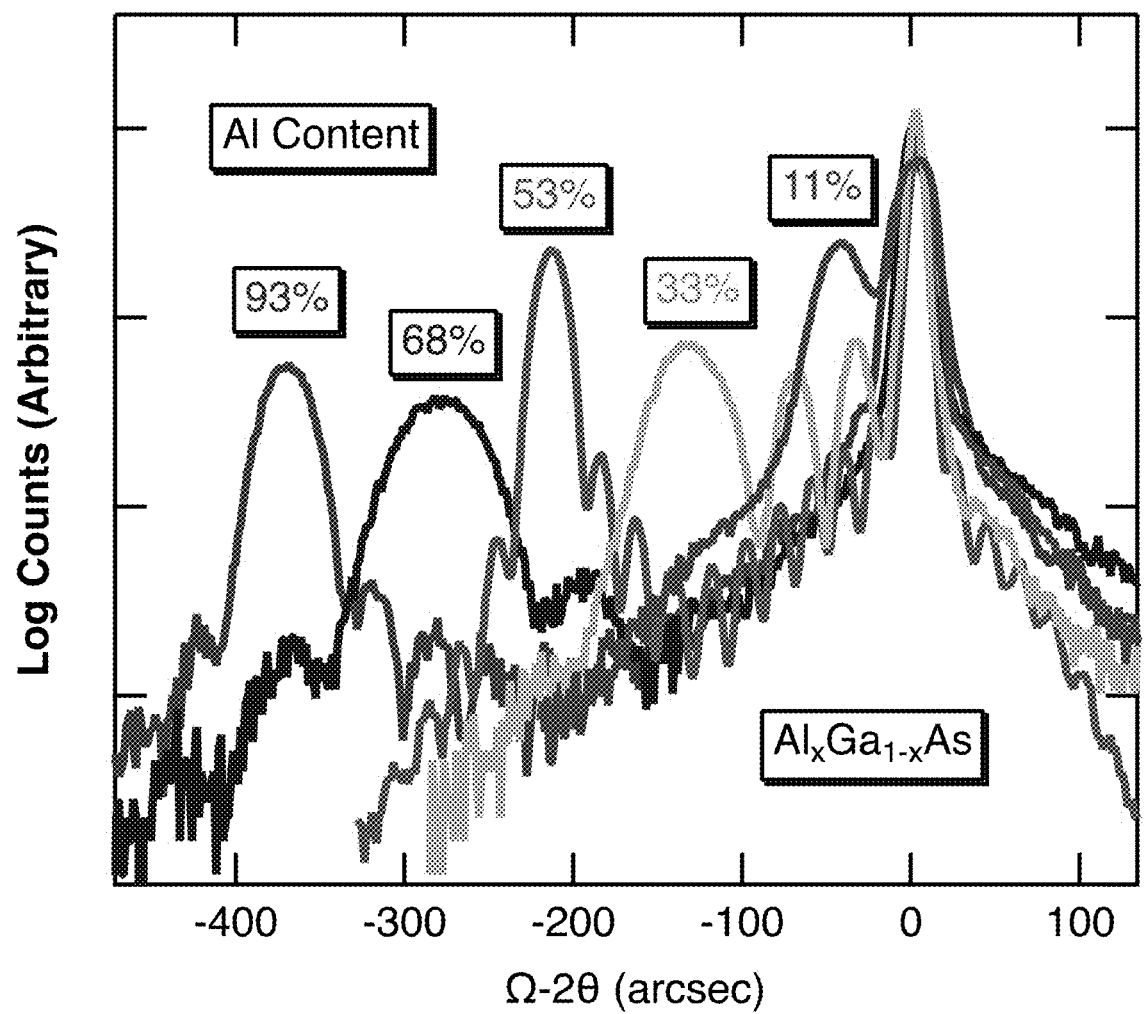
FIG. 8 depicts (004) omega-2theta HRXRD scans of $Al_xGa_{1-x}As$ epilayers nearly spanning the entire compositional space.

The external Al generator allows for the controlled deposition of Al-containing compounds by HYPE. All of these various growth trends were combined to achieve $Al_xGa_{1-x}As$ in the compositional space between $x_{Al}$=0-1. FIG. 8 shows (004) x-ray diffraction curves for samples with Al content varying from 0.11 to 0.93. The Al-generator also allows for deposition of Al-phosphide compounds by HYPE, which up to this point have never been demonstrated by this growth technique.

Figures 9A, 9B:
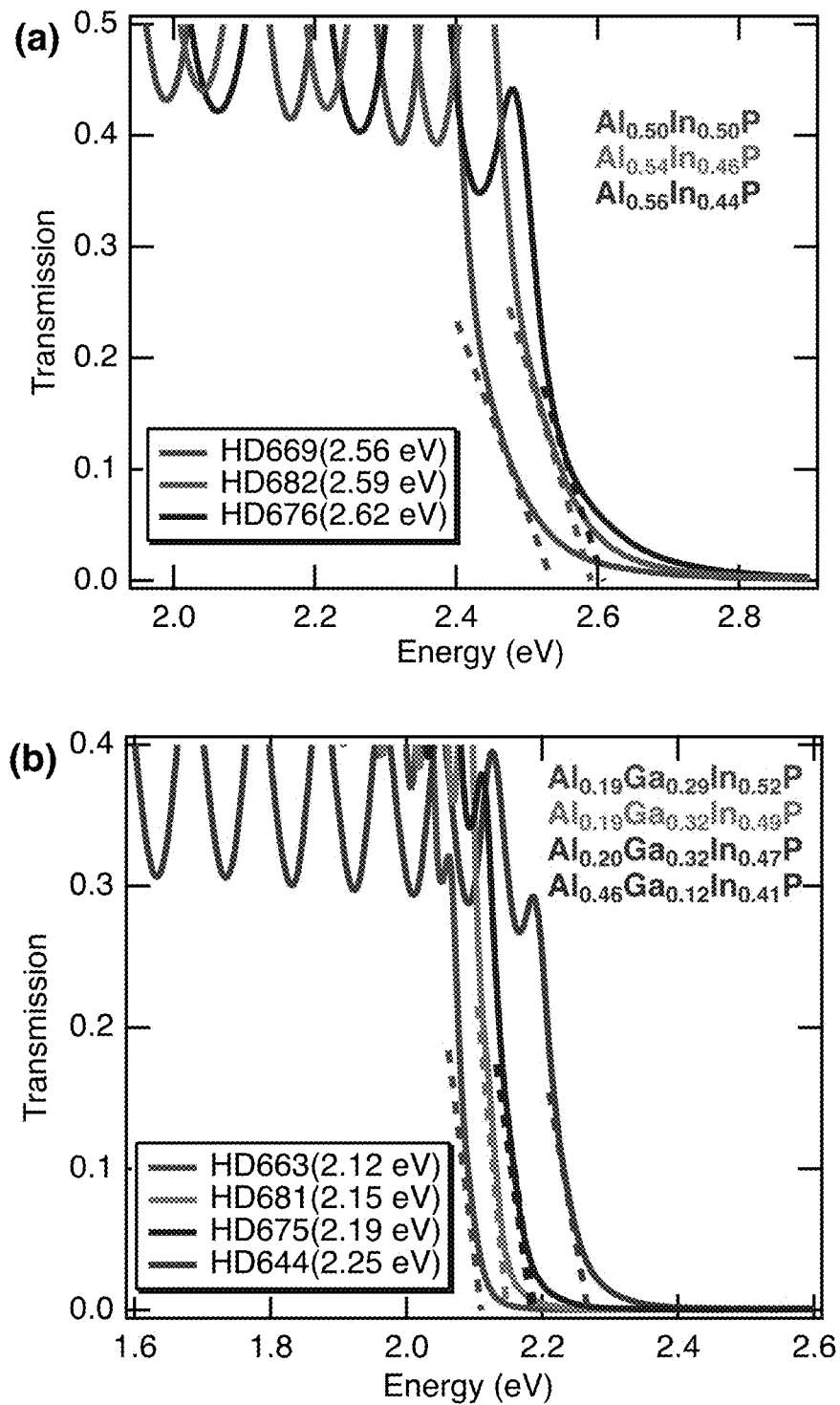
FIGS. 9a and 9b depict transmission spectra of in FIG. 9a, $Al_xIn_{1-x}P$ and FIG. 9b, $Al_xGa_yIn_{1-x-y}P$ epilayers bonded to glass.

FIG. 9 shows transmission measurements of (a) $Al_xIn_{1-x}P$ and (b) $Al_xGa_yIn_{1-x-y}P$ epilayers with compositions closely lattice-matched to GaAs. These wide band gap materials are useful in many III-V devices. For example, they can be readily integrated into devices such as solar cells to provide transparent passivation for front and rear surfaces or as the active layers in LED devices that emit at green wavelengths.

Figure 10:
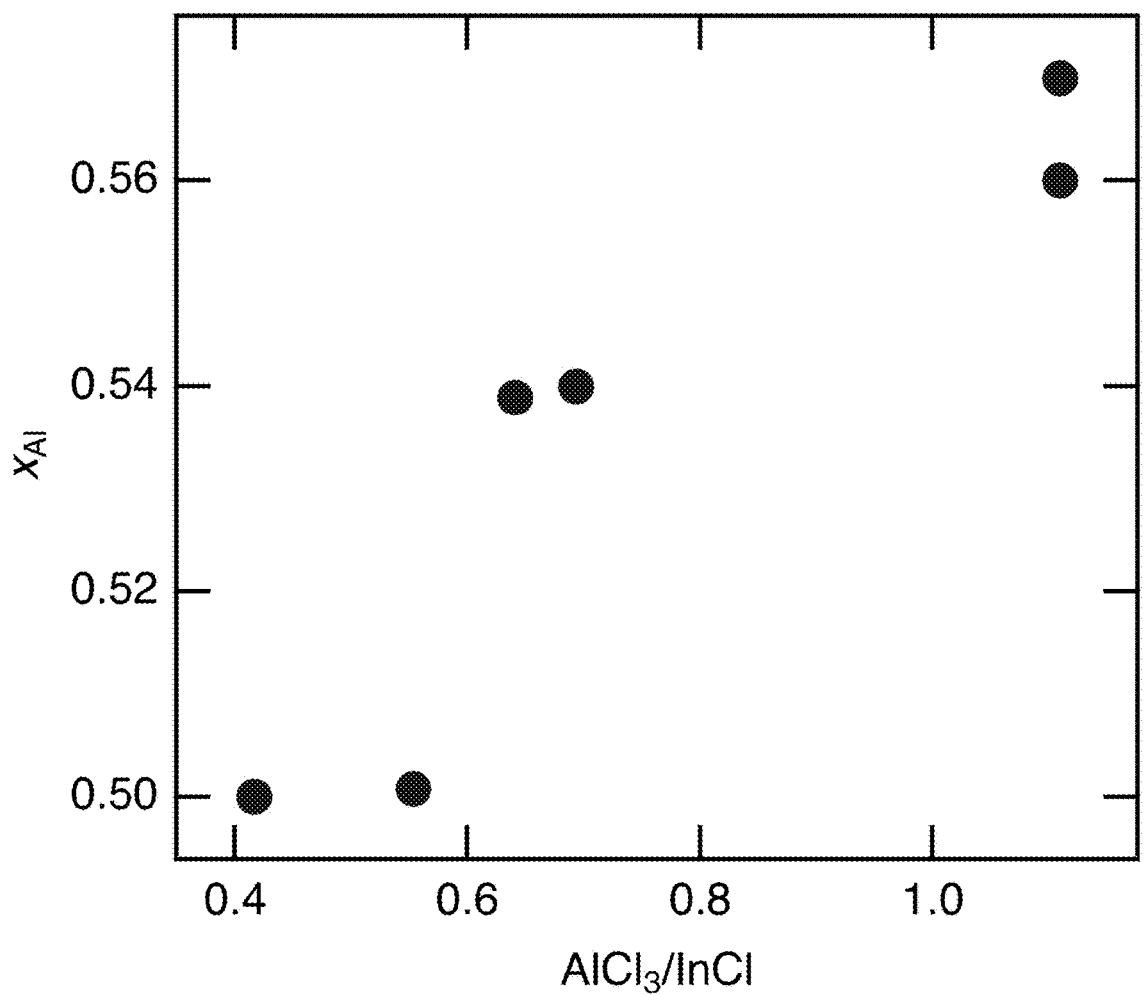
FIG. 10 depicts $x_{Al}$ in $Al_xIn_{1-x}P$ for epilayers grown nearly lattice-matched to GaAs as a function of $InCl/AlCl_3$ ratio, assuming complete conversion of HCl to $MCl_x$.
Figure 11:
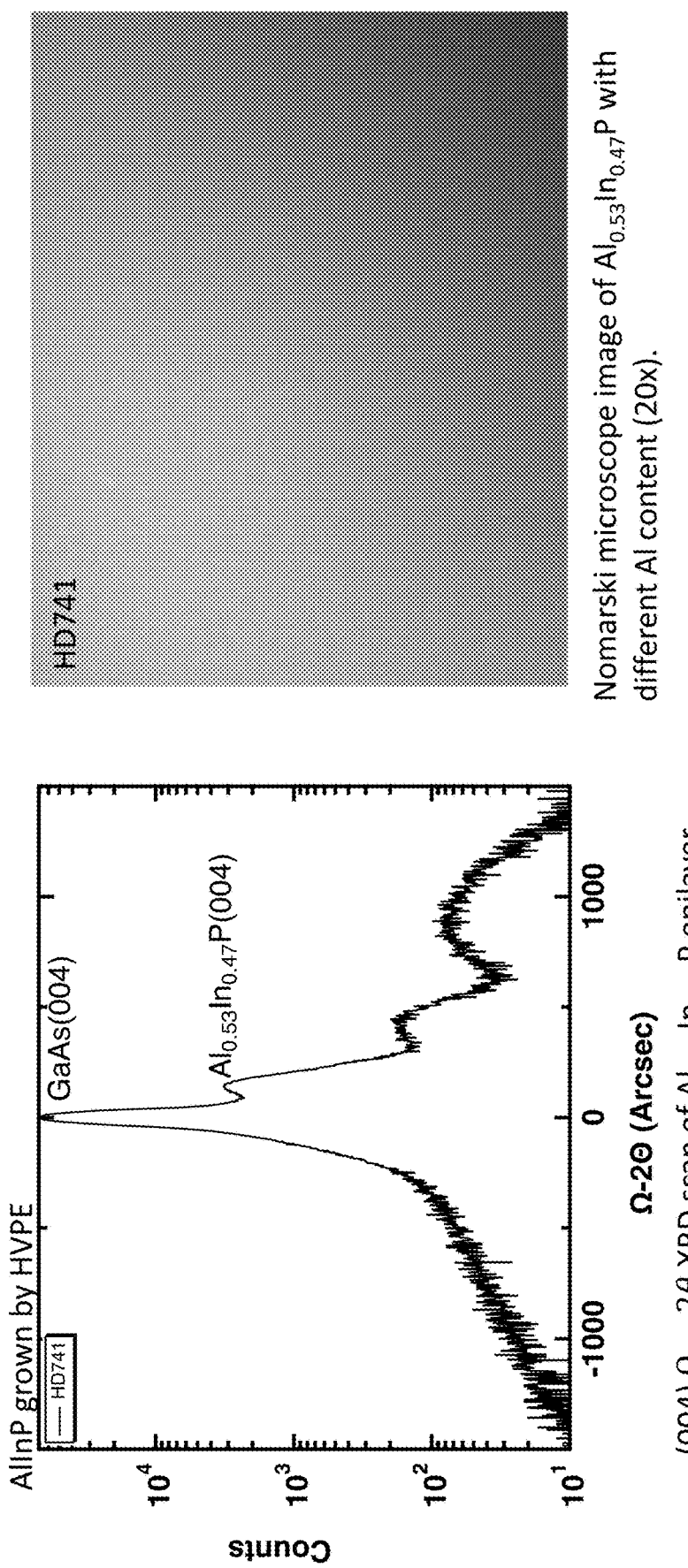
FIG. 11 depicts the X-ray (004) scan and Nomarski image of lattice matched AlInP grown by HVPE using methods and reactors as disclosed herein.
Figure 12:
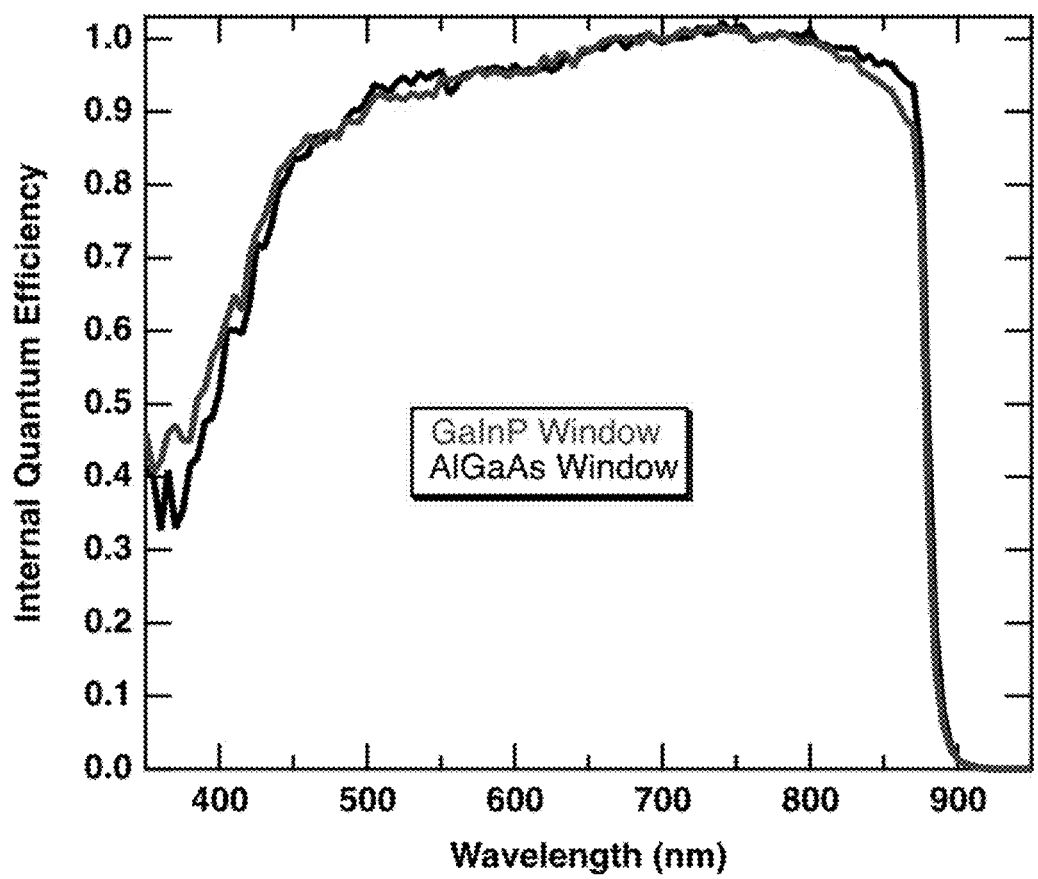
FIG. 12 depicts the internal quantum efficiency at various wavelengths of light for an AlGaAs passivated single junction GaAs solar cell.

FIG. 10 shows $x_{Al}$ for $Al_xIn_{1-x}P$ epilayers grown near the lattice-matched composition as a function of $AlCl_3$/InCl ratio. Relative to $Al_xGa_{1-x}As$ growth, small $AlCl_3$/InCl ratios are preferred to achieve a 50/50 solid composition, implying that the growth of $Al_xIn_{1-x}P$ is controllable through use of the $AlCl_3$ precursor. The growth of these phosphide materials for the first time as disclosed herein allows for new and more efficient devices to be grown by HYPE.

EXPERIMENTAL

Figure 2:
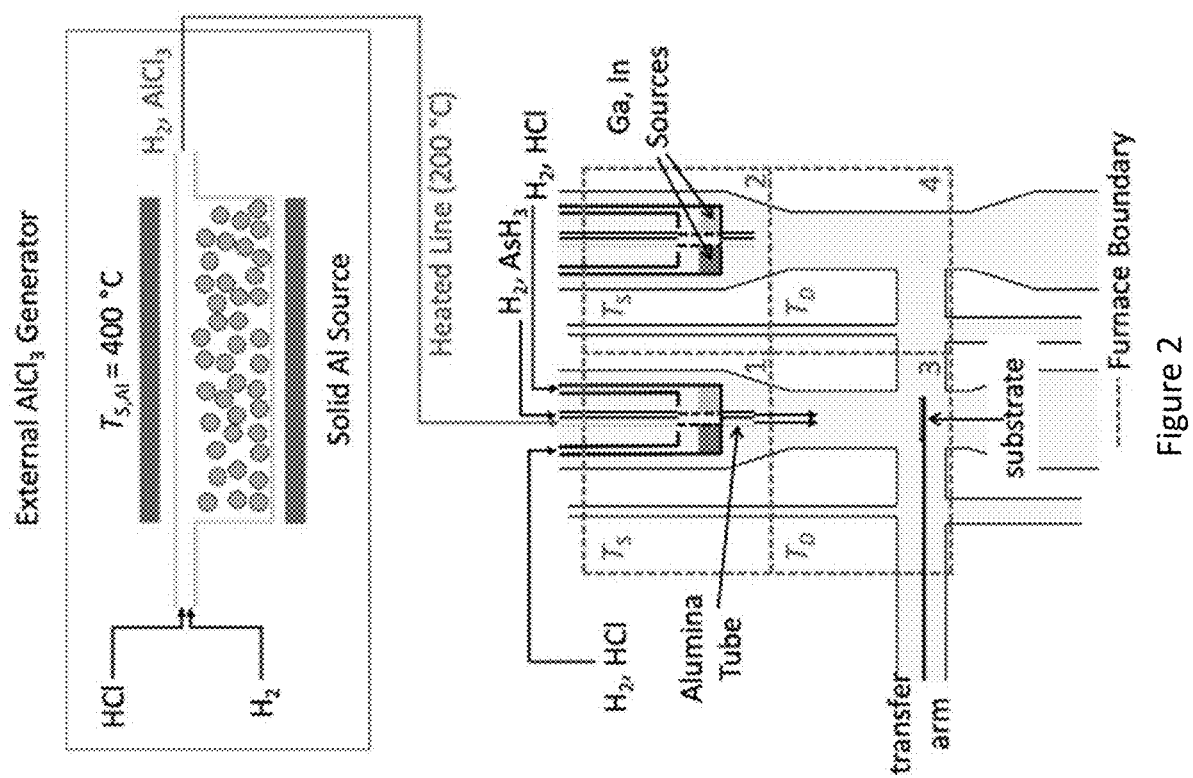
FIG. 2 depicts a diagram of an embodiment of an HVPE reactor used in methods disclosed herein, including an external $AlCl_3$ generator (not to scale).

Materials were grown in an atmospheric pressure, dual-chamber HVPE reactor shown in FIG. 2. GaCl and InCl were generated in situ from HCl and elemental Ga and In in the upper temperature zones 1 and 2 at a temperature of 800° C., except where stated. Substrates were (100)-oriented GaAs with an offcut of 6° towards the (111)A plane. $AlCl_3$ was generated externally of the reactor in a separate quartz boat enclosed in clamshell furnace. The Al furnace temperature was 400° C. in order to promote generation of $AlCl_3$ over AlCl. Al precursor generation was controlled by the flow rates of HCl and $H_2$ carrier to the boat as indicated in FIG. 2. The process lines that deliver the Al precursor to the reactor were heated to 200° C. using insulated heat tapes to prevent solidification of the $AlCl_3$ and subsequent clogging of the lines. The Al-line is plumbed into the reactor through an alumina tube that extends through the majority of the 800° C. upper source zones. The alumina tube is inert to reaction with $AlCl_3$ or decomposition byproducts, and has an inner diameter of 4 mm to promote a high velocity through the higher temperature source zone.

GaAs/$Al_xGa_{1-x}As$/GaAs structures were grown and analyzed for Al solid content and $Al_xGa_{1-x}As$ growth rate. The deposition temperature in zones 3 and 4 ($T_D$) was 650° C. except where noted. $AsH_3$ was the group V precursor. $Al_xGa_{1-x}As$ lattice constant was measured using high resolution x-ray diffraction of the (004) plane and used to compute $x_{Al}$ via Vegard's law. Epilayer thickness and growth rate were determined by fitting of the sample reflectance using a transfer matrix method and data for n and k were calculated. $Al_xIn_{1-x}P$ and $Al_xGa_yIn_{1-x-y}P$ epilayers were also grown at a temperature of 650° C. from $AlCl_3$, InCl, GaCl and $PH_3$. Composition of the quaternary was determined through measurement of the lattice constant by x-ray diffraction and band gap determination from spectroscopic transmission measurements. Transmission samples were fabricated by bonding the epilayer to a glass handle with transparent epoxy and selectively etching away the absorbing substrate using an ammonium hydroxide/hydrogen peroxide based etchant.

Using methods and devices disclosed herein, a method for the controlled deposition of Al-containing III-V materials by HVPE through use of an external $AlCl_3$ generator was demonstrated. The generation of $AlCl_3$ vs. AlCl was selected for through the use of a 400° C. source temperature, enabling reliable control of the solid Al-composition. It was shown that the $AlCl_3$ molecule was insensitive to decomposition at typical source and deposition temperatures in the reactor as used herein. The effects of growth conditions such as deposition temperature, V/III ratio, and group V species on $Al_xGa_{1-x}As$ solid composition and $Al_xGa_{1-x}As$ growth rate were determined. It was discovered that conditions selecting for $AsH_3$ over $As_2$/$As_4$ strongly promoted incorporation of Al in the film. Control over $Al_xGa_{1-x}As$ composition in the entire range from $x_{Al}$=0-1 as well as the growth of near-lattice-matched $Al_xIn_{1-x}P$ and $Al_xGa_yIn_{1-x-y}P$ was achieved for the first time by HYPE. These results allow for the growth of new high-performance optoelectronic devices by HYPE.

The foregoing disclosure has been set forth merely to illustrate the invention and is not intended to be limiting.

We claim:

1. A method for the deposition of Al-containing III-V materials by hydride vapor phase epitaxy (HVPE) through use of an external $AlCl_3$ generator; wherein the $AlCl_3$ molecules do not decompose during the deposition process.

2. The method of claim 1 wherein the source temperature of the external $AlCl_3$ generator is about 400 degrees Celsius.

3. The method of claim 1 wherein a deposition temperature ranges from 620 to 700 degrees Celsius.

4. The method of claim 1 wherein the Al-containing III-V materials comprise $Al_xGa_{1-x}As$ where x is from 0 to 1.

5. The method of claim 4 wherein the V/III ratio of Al-containing III-V materials is from 10 to 300.

6. The method of claim 1 wherein the group V species is selected from the group consisting of nitrogen, phosphorus, arsenic, and antimony.

7. The method of claim 1 further comprising the use of $AsH_3$.

8. An optoelectronic device made by using a method for the deposition of Al-containing III-V materials by HVPE through use of an external $AlCl_3$ generator;
wherein the $AlCl_3$ molecules do not decompose during the deposition process.

9. The optoelectronic device of claim 8 wherein the source temperature of the external $AlCl_3$ generator is about 400 degrees Celsius.

10. The optoelectronic device of claim 8 wherein a deposition temperature ranges from 620 to 700 degrees Celsius.

11. The optoelectronic device of claim 8 wherein the Al-containing III-V materials comprise lattice-matched $Al_xIn_{1-x}P$ and $Al_xGa_yIn_{1-x-y}P$.

* * * * *